US010597953B2

(12) United States Patent
Finlay et al.

(10) Patent No.: US 10,597,953 B2
(45) Date of Patent: Mar. 24, 2020

(54) SENSOR FOR A FINGERBOARD LATCH ASSEMBLY

(71) Applicant: Salunda Limited, Oxfordshire (GB)

(72) Inventors: Alan Patrick John Finlay, Herefordshire (GB); John Mark Newton, Oxfordshire (GB); Andrew Henry John Larkins, Berkshire (GB); Mathew William Davis, Stithians Cornwall (GB); Grant Nicholls, Romsey Hampshire (GB)

(73) Assignee: Salunda Limited, Oxfordshire (GB)

( * ) Notice: Subject to any disclaimer, the term of this patent is extended or adjusted under 35 U.S.C. 154(b) by 0 days.

(21) Appl. No.: 16/039,058

(22) Filed: Jul. 18, 2018

(65) Prior Publication Data

US 2018/0328124 A1 Nov. 15, 2018

Related U.S. Application Data

(63) Continuation of application No. PCT/GB2017/051972, filed on Jul. 4, 2017.

(30) Foreign Application Priority Data

Jul. 5, 2016 (GB) .................................. 1611744.2
Sep. 5, 2016 (GB) .................................. 1615037.7
(Continued)

(51) Int. Cl.
*E21B 19/14* (2006.01)
*F16L 3/00* (2006.01)
(Continued)

(52) U.S. Cl.
CPC .............. *E21B 19/14* (2013.01); *E21B 23/04* (2013.01); *E21B 47/09* (2013.01); *F16B 39/12* (2013.01);
(Continued)

(58) Field of Classification Search
CPC ...... E21B 19/14; E21B 19/143; E21B 19/146; E21B 47/09; E21B 47/011;
(Continued)

(56) References Cited

U.S. PATENT DOCUMENTS 3,799,364 A 3/1974 Kelly et al.
3,799,634 A 3/1974 Sernetz et al.
(Continued)

FOREIGN PATENT DOCUMENTS

CN 202520252 U 11/2012
DE 3115587 A1 11/1982
(Continued)

OTHER PUBLICATIONS

Ha et al. "A Wireless MEMS-Based Inclinometer Sensor Node for Structural Health Monitoring", Sensors, vol. 13, No. 12, Nov. 26, 2013.
(Continued)

*Primary Examiner* — George S Gray
(74) *Attorney, Agent, or Firm* — Honigman LLP

(57) ABSTRACT

A sensor unit for a fingerboard latch assembly comprising a latch bracket and a latch rotatably mounted on the latch bracket comprises a sensor arranged to sense the orientation of the latch and a wireless, optical or other communication unit arranged to communicate the orientation of the latch sensed by the sensor. The sensor unit may be mountable on the latch and comprise an orientation sensor arranged to take measurements that are dependent on the orientation of the sensor unit, and a processor arranged to derive an orientation signal representing the orientation of the latch from the measurements, the communication unit being arranged to communicate the orientation signal. A monitoring system receives the sensed orientations from plural sensor units.

16 Claims, 11 Drawing Sheets

(30) Foreign Application Priority Data

| Nov. 9, 2016 | (GB) | 1618910.2 |
| Nov. 9, 2016 | (GB) | 1618935.9 |
| Jan. 19, 2017 | (GB) | 1700925.9 |
| Jan. 25, 2017 | (GB) | 1701273.3 |
| Feb. 28, 2017 | (GB) | 1703269.9 |
| Apr. 3, 2017 | (GB) | 1705355.4 |

(51) Int. Cl.
*F16B 39/12* (2006.01)
*G01R 33/07* (2006.01)
*E21B 23/04* (2006.01)
*E21B 47/09* (2012.01)
*G01D 7/00* (2006.01)
*G08C 17/02* (2006.01)
*G08C 23/04* (2006.01)
*E21B 19/15* (2006.01)
*H04W 16/28* (2009.01)

(52) U.S. Cl.
CPC ............. *F16L 3/00* (2013.01); *G01D 7/005* (2013.01); *G01R 33/072* (2013.01); *G08C 17/02* (2013.01); *G08C 23/04* (2013.01); *E21B 19/15* (2013.01); *G01R 33/07* (2013.01); *H04W 16/28* (2013.01)

(58) Field of Classification Search
CPC ..... E21B 47/0905; E21B 23/04; G01R 33/07; G01D 11/30; F16L 3/00; H01H 36/0033; H03K 17/9545
See application file for complete search history.

(56) References Cited

U.S. PATENT DOCUMENTS

| 4,042,123 A | 8/1977 | Sheldon et al. |
| 4,044,895 A | 8/1977 | Adair |
| 4,739,264 A | 4/1988 | Kamiya et al. |
| 4,914,263 A | 4/1990 | Behr |
| 4,947,690 A | 8/1990 | Cleveland |
| 5,866,818 A * | 2/1999 | Sumi ............ G01P 1/023 73/493 |
| 6,533,494 B1 | 3/2003 | Gordon |
| 6,851,306 B2 | 2/2005 | Shost et al. |
| 6,892,812 B2 | 5/2005 | Niedermayr et al. |
| 7,134,334 B2 | 11/2006 | Schirmer et al. |
| 7,510,028 B2 | 3/2009 | Welsh |
| 9,404,346 B2 | 8/2016 | Gray et al. |
| 2005/0092524 A1 | 5/2005 | Herst |
| 2005/0194185 A1* | 9/2005 | Gleitman ............ E21B 17/003 175/45 |
| 2006/0124353 A1 | 6/2006 | Juhasz et al. |
| 2009/0238663 A1 | 9/2009 | Littlely |
| 2010/0089159 A1 | 4/2010 | Younsi et al. |
| 2010/0104401 A1 | 4/2010 | Hopkins et al. |
| 2010/0149797 A1* | 6/2010 | Cordes ............ H05B 37/029 362/234 |
| 2010/0303586 A1 | 12/2010 | Hankins et al. |
| 2011/0295546 A1 | 12/2011 | Khazanov |
| 2012/0020758 A1 | 1/2012 | Springett et al. |
| 2012/0038486 A1 | 2/2012 | Sinclair et al. |
| 2012/0103623 A1 | 5/2012 | Wijning et al. |
| 2012/0305261 A1 | 12/2012 | Roodenburg et al. |
| 2012/0319503 A1 | 12/2012 | Johnson |
| 2013/0032405 A1 | 2/2013 | Braxton |
| 2013/0096731 A1 | 4/2013 | Tamari et al. |
| 2015/0010372 A1 | 1/2015 | Herrema |
| 2015/0077219 A1 | 3/2015 | Keller, Jr. et al. |
| 2016/0076920 A1 | 3/2016 | Newton et al. |
| 2016/0201408 A1 | 7/2016 | Little et al. |
| 2016/0208566 A1* | 7/2016 | Bowley ............ E21B 19/155 |
| 2017/0306710 A1 | 10/2017 | Trydal et al. |
| 2018/0058158 A1* | 3/2018 | Rice, II ............ E21B 19/14 |

FOREIGN PATENT DOCUMENTS

| EP | 2554754 A1 | 2/2013 |
| EP | 2554784 A2 | 2/2013 |
| GB | 1588849 A | 4/1981 |
| GB | 2175629 A | 12/1986 |
| WO | 2010141287 A2 | 12/2010 |
| WO | 2012012326 A1 | 1/2012 |
| WO | 2015/015150 A1 | 2/2015 |
| WO | 2016075478 A1 | 5/2016 |

OTHER PUBLICATIONS

U.S. Appl. No. 62/381,822, filed Aug. 31, 2016.
U.S. Appl. No. 62/413,672, filed Oct. 27, 2016.
Office Action for U.S. Appl. No. 16/039,108 dated Oct. 3, 2018.

* cited by examiner

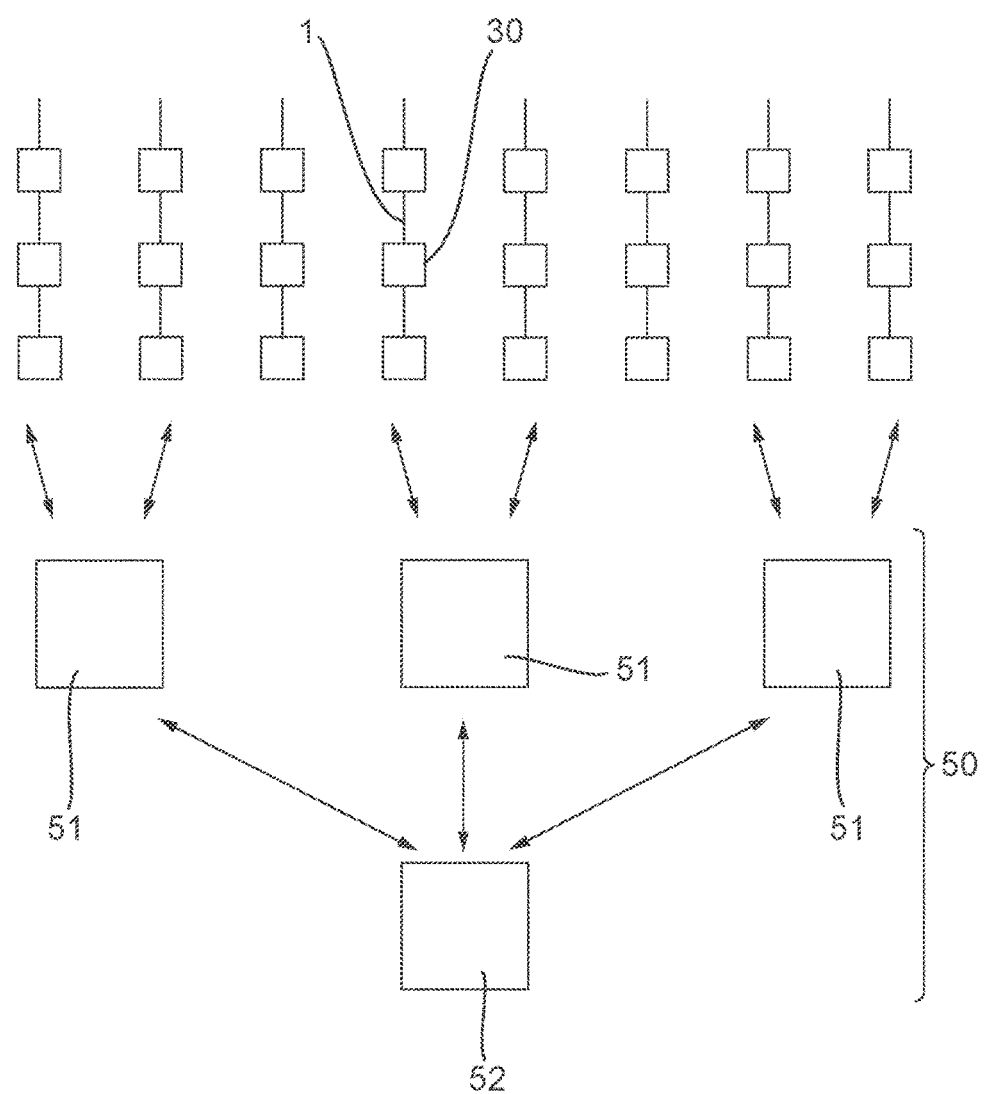

SENSOR FOR A FINGERBOARD LATCH ASSEMBLY

CROSS-REFERENCE TO RELATED APPLICATIONS

This U.S. Application is a Continuation of Application PCT/GB2017/051972 filed on Jul. 4, 2017. The entire contents of this application is incorporated herein by reference in its entirety.

TECHNICAL FIELD

The present invention relates to a sensor for a fingerboard latch assembly.

BACKGROUND

Fingerboards are used to store tubulars, for example drill pipes, drill collars and casings, used in the oil and gas industry, for example adjacent to a drilling derrick on an oil or gas rig. An array of horizontally extending fingerboards are provided between which the tubulars are vertically stacked. Latches are used to secure tubulars between the fingerboards. The latches are provided as part of fingerboard latch assemblies mounted to the fingerboards. A fingerboard latch assembly typically comprises: a latch bracket and a latch rotatably mounted on the latch bracket.

It is desirable to sense the orientation of the latch. This is important to provide safety during operation of the latch. In the event of a failure in the latch actuation system, which is typically pneumatic, then the latch might not be in the expected position. This can result in the fingerboard latch assembly and the associated mechanism for handling the tubulars failing to operate properly. This may lead to the tubulars becoming insecure and causing damage to equipment or becoming a danger to workers.

SUMMARY

According to a first aspect of the present invention, there is provided a sensor unit for a fingerboard latch assembly, which comprises a latch bracket and a latch rotatably mounted on the latch bracket, the sensor unit comprising: a sensor arranged to sense the orientation of the latch; and a wireless communication unit arranged to wirelessly communicate the orientation of the latch sensed by the sensor.

Thus, the orientation of the latch is sensed by the sensor and wirelessly communicated by the wireless communication unit, for example to a monitoring system. This allows for monitoring of the latch orientation and for remote location of the sensor unit on a fingerboard latch assembly without the need to make a wired connection. That reduces installation difficulties and avoids risks associated with damage to the wires.

The wireless communication interface may comprise a radio communication interface. This allows the wireless communication to be effected in an efficient and reliable manner.

Additionally or alternatively, the wireless communication unit may comprise a light source and be arranged to modulate the light output by the light source to represent the orientation of the latch. This allows for a wireless sensor unit to be provided that is suitable for use in remote locations without the need to make an electrical connection, as the output of the light source may be monitored. Modulating a light source to represent with the position of the latch allows for a wireless sensor unit to be provided that is suitable for use in remote locations without the need to make an electrical connection, as the output of the light source may be monitored.

The sensor unit may be mountable on the latch and include an orientation sensor that takes measurements that are dependent on the orientation of a sensor unit. In this case, a processor may be arranged to derive an orientation signal representing the orientation of the latch from the measurements and the wireless communication unit may be arranged to communicate the orientation signal. Such measurements allow for a simple and reliable detection of the orientation of the latch with respect to the latch bracket. In particular, it allows the use of a type of sensor that is simpler than a typical external sensor with sufficiently reliable sensing. Similarly, the sensor unit may have a relatively low power consumption permitting use of an internal power source such as a battery and being capable of being run for extended periods of time.

The processor may be further arranged to associate metadata with the latch position signal. Such metadata may include one of more of: time information; sensor identity, latch identity, number of latch cycles, count of latch being in open position, count of latch being in closed position, latch speed, latch acceleration, latch angle, battery level, orientation sensor signal level; signal polarization, antennae signal strength, sensor location, signal triangulation, and location, which may be detected by a geolocation unit in the sensor unit.

The sensor unit may be shaped to fit within an aperture in the latch. This allows mounting using an aperture of the type typically provided in a latch, for example of the type used for securing a latch retainer.

In one type of configuration, the sensor unit may comprise a housing that houses electronic components including the orientation sensor and a retaining member configured to engage with the housing and retain the sensor unit in the aperture, for example by screw threads configured to be screwed together. This allows for retrofitting of the sensor unit on an existing latch having an aperture.

The housing and the retaining member may comprise a ratchet arrangement configured to permit screwing of the retaining member onto the housing and to prevent unscrewing. This provides for a reliable retention of the sensor unit on the latch.

In another type of configuration, the sensor unit may be encapsulated into the latch.

A further aspect of the present invention relates to energy harvesting.

According to the further aspect of the present invention, there is provided an energy harvesting system arranged to harvest energy from a pressurized fluid, the energy harvesting system comprising a rotor placed in-line and an electrical generator driven by the rotor to generate electrical energy.

Pressurized fluids are commonplace in industrial settings and are used to power machinery, tools and equipment. The energy harvesting system allows energy to be harvested from such systems. The fluid may be compressible or incompressible.

The pressurized fluid may be fluid in a pneumatic or hydraulic line, in which case the rotor may be placed in-line within the pneumatic or hydraulic line. Hydraulic and pneumatic lines transmit energy via liquid (incompressible) and gaseous (compressible) fluids respectively. Large amounts of potential energy may be stored and transmitted around factories, vehicles and plants and over long distances in this manner. Pressurized fluids, be it hydraulic or pneumatic, are commonplace in industrial settings therefore scavenging energy is a practical and attractive means of powering a miniature system.

BRIEF DESCRIPTION OF THE DRAWINGS

Embodiments of the present invention will now be described by way of non-limitative example with reference to the accompanying drawings, of which

FIG. 26 is a diagram of a monitoring system.

DESCRIPTION

Figure 1:
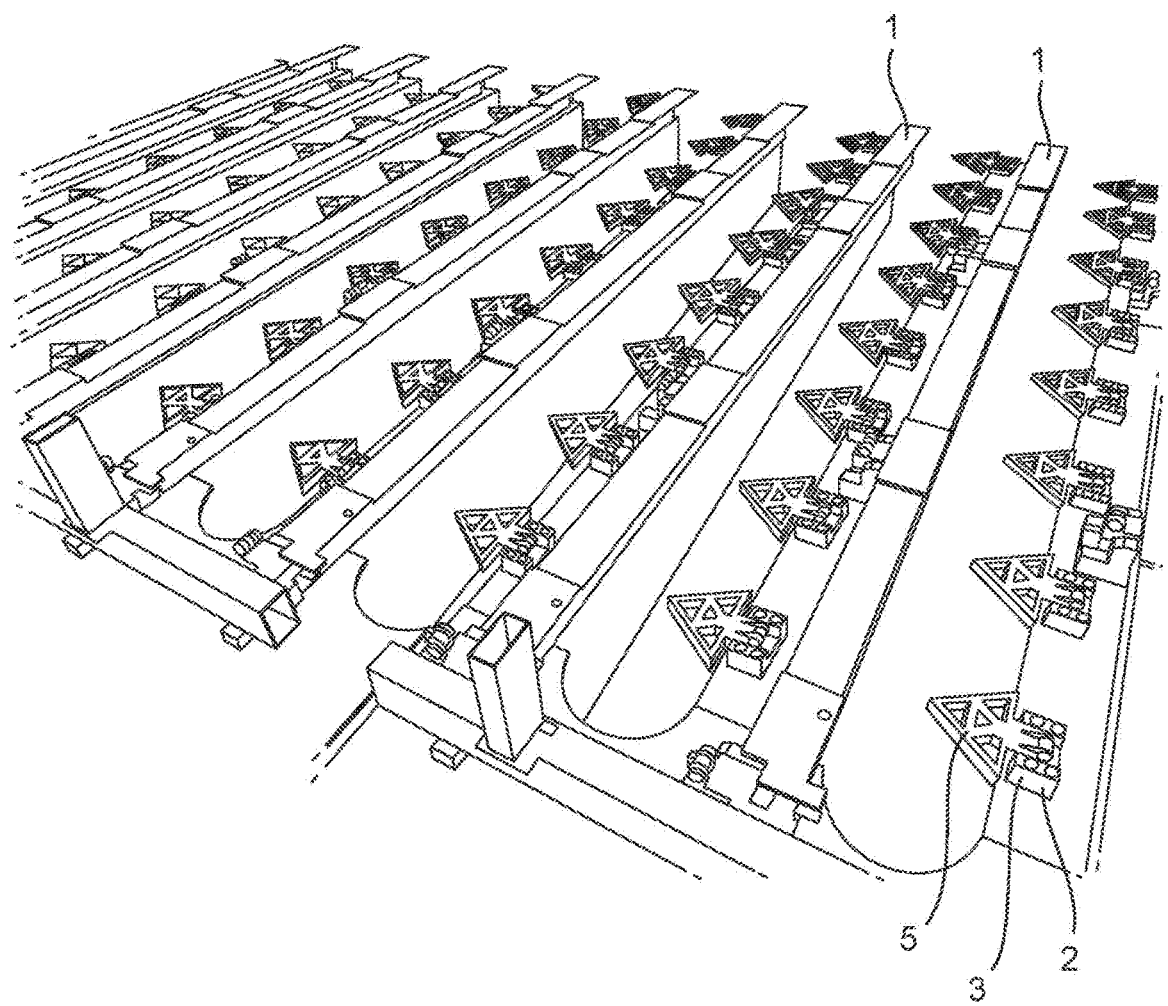
FIG. 1 is a photograph illustrating the typical configuration of a standard fingerboard array.
Figure 2:
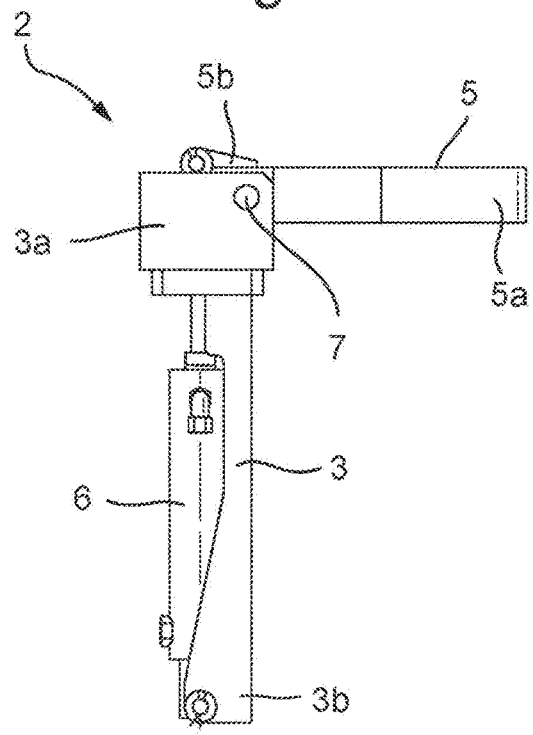
FIG. 2 is a side view of a fingerboard latch assembly.
Figure 3:
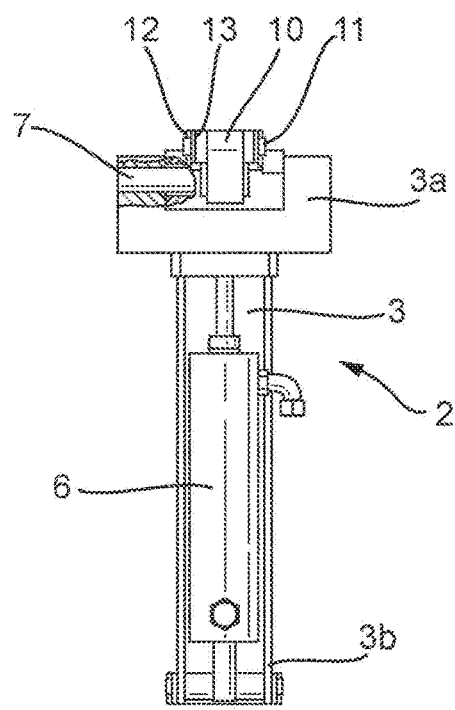
FIG. 3 is a rear view of the fingerboard latch assembly.
Figure 4:
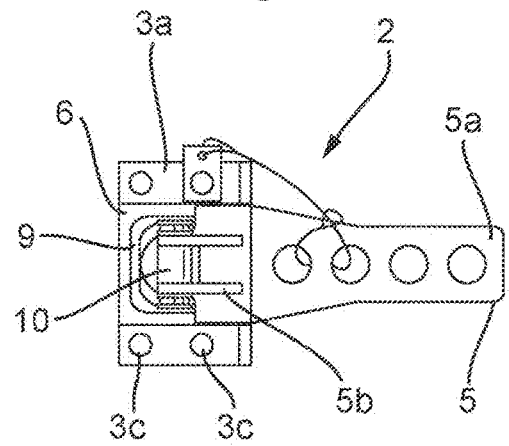
FIG. 4 is a top view of the fingerboard latch assembly.
Figure 5:
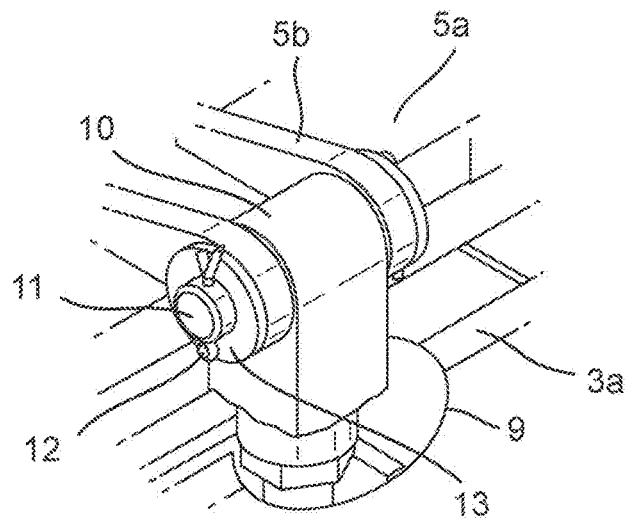
FIG. 5 is a perspective partial view of the fingerboard latch assembly.

FIG. 1 shows the construction of a standard array of fingerboards 1 with plural fingerboard latch assemblies 2 mounted in an along each fingerboard 1. Each fingerboard latch assembly 2 comprises a latch bracket 3 and a latch 5 rotatably mounted on the latch bracket 3.

FIGS. 2 to 5 illustrate a specific fingerboard latch assembly 2 that will now be described. This fingerboard latch assembly 2 has a latch 5 configured to retain a drill pipe or casing. In general, the configuration of the latch 5 may be varied depending on the type of tubular with which the fingerboard latch assembly 2 is intended to be used. For example, the latches 5 shown in FIG. 1 have a different configuration. With appropriate choice of the configuration of the latch 5, the fingerboard latch assembly 2 may be used to retain a tubular of any type, for example a drill pipe, drill collar or casing.

The remainder of the fingerboard latch assembly 2 may have generally the same arrangement, as described below, for any configuration of the latch 5, including that shown in FIG. 1.

The fingerboard latch assembly 2 comprises a latch bracket 3 that comprises a latch bracket head 3a and an elongated body 3b extending downwardly from the bracket head 3a. The fingerboard latch assembly 2 is mounted to a fingerboard 1 using bolts 4 attached through bolt apertures 3c in the latch bracket 3. The fingerboard latch assembly 2 also comprises a pneumatic cylinder 6 secured to the latch bracket 3.

The fingerboard latch assembly 2 further comprises a bracket pin 7 connecting the latch 5 and bracket head 3a. The bracket pin 7 provides a pivot point allowing rotation of the latch 5 between an open and closed position (orientation). In FIGS. 1 to 5, the latch 5 is in the closed position in which the latch 5 extends horizontally. In the open position, the latch 5 extends vertically.

The latch 5 comprises an arm 5a that, in the closed position of the latch 5, extends forwardly from the bracket pin 7 for restraining a tubular. In the open position of the latch 5, the arm 5a of the latch 5 extends upwards from the bracket pin 7, allowing removal of a tubular. The arm 5a of the latch 5 is a movable metal member that creates a void between the fingerboard latch assemblies 2 and between the fingerboards 1 for a tubular to be secured.

The latch 5 also comprises a crank portion 5b that extends rearwardly from the bracket pin 7. The latch bracket head 3a has an aperture 9 to provide clearance between the latch bracket 3 and the crank portion 5b, as the latch 5 rotates.

The pneumatic cylinder 6 comprises a piston head 10 which is connected to the crank portion 5b by way of a latch/cylinder pin 11. A split pin 12 prevents the latch/cylinder pin 11 from falling out of the piston head 10, and a washer 13 provides a wear barrier between the split pin 12 and piston head 10. Thus, the pneumatic cylinder 6 drives rotation of the latch 5 between the open and closed positions. To move the latch 5 from the closed position shown in FIGS. 1 to 5 into the open position in which the latch 5 extends vertically, the pneumatic cylinder 6 drives the piston head 10 downwardly.

Figure 6:
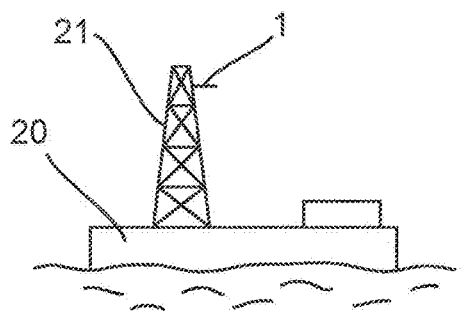
FIG. 6 is a schematic view of a floating platform on which the fingerboard latch assembly is mounted.

As shown in FIG. 6, the fingerboards 1 and hence fingerboard latch assemblies 2 are mounted on a floating platform 20. In this example, the fingerboards 1 are mounted on a derrick 21 on the floating platform 20. Although illustrated schematically in FIG. 6, the floating platform 20 may be any type of platform including a ship, typically being a platform suitable for offshore oil and gas exploration or drilling operations.

Figure 7:
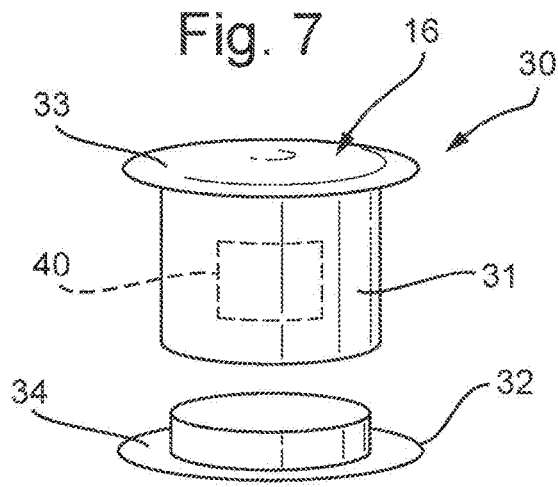
FIG. 7 is a perspective view of a sensor unit in a first configuration.

FIG. 7 illustrates a sensor unit 30 in a first configuration. The sensor unit 30 comprises a housing 31 that houses a sensor circuit 40 described in more detail below.

Figure 8:
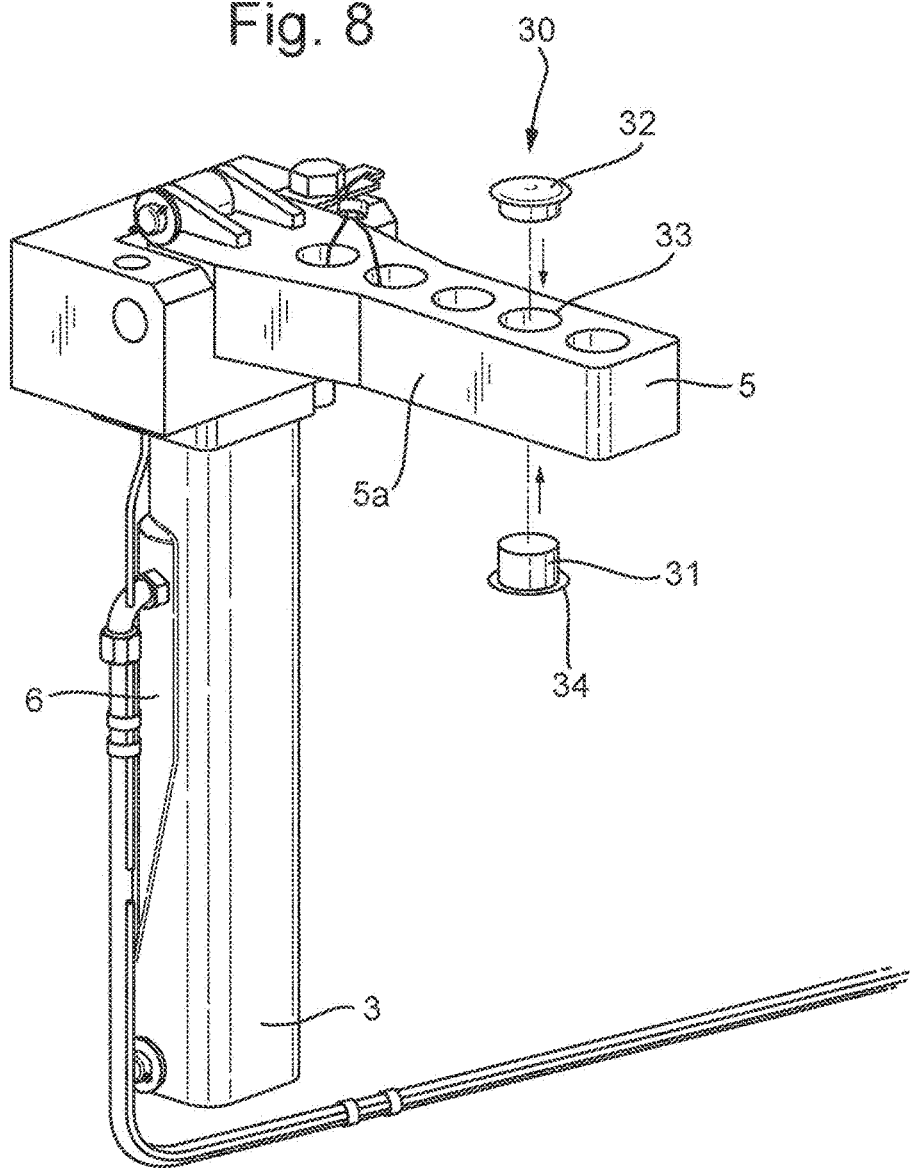
FIG. 8 is a perspective view of the fingerboard latch assembly having a sensor unit mounted thereon.

The sensor unit 30 is mountable on the latch of a fingerboard latch assembly 2 as shown in FIG. 8. The sensor unit 30 may be mounted to the latch 5 at the time of manufacture of the latch 5, or may be mounted to the latch 5 after deployment of the fingerboard latch assembly 2 as a retro-fit.

In this example, the housing 31 of the sensor unit 30 is configured to fit within an aperture 33 within the latch arm 5a of the latch 5. For mounting, the housing 31 is inserted into the aperture 33. The sensor unit 30 further comprises a retaining member 32 which is configured to engage with the housing 31 after insertion into the aperture 33, by any suitable means, for example a friction fit or a screw fit, and thereby to retain the sensor unit 30 in the aperture 33.

The housing 31 and retaining member 32 have respective flanges 33 and 34 which are wider than the aperture 33 and so secure the sensor unit 30 to the latch 5. This manner of mounting the sensor unit 30 to the latch 5 is not limitative. The sensor unit 30 may be mounted to the latch 5 using any suitable mechanical arrangement, so the sensor unit may include a housing 31 in some other form and the retaining member 32 might be omitted.

FIGS. 9 to 16 illustrate a sensor unit 30 in a second configuration which will now be described. Elements in common with the first configuration are given common reference numerals and have above description applies, except for the differences now explained.

Figure 9:
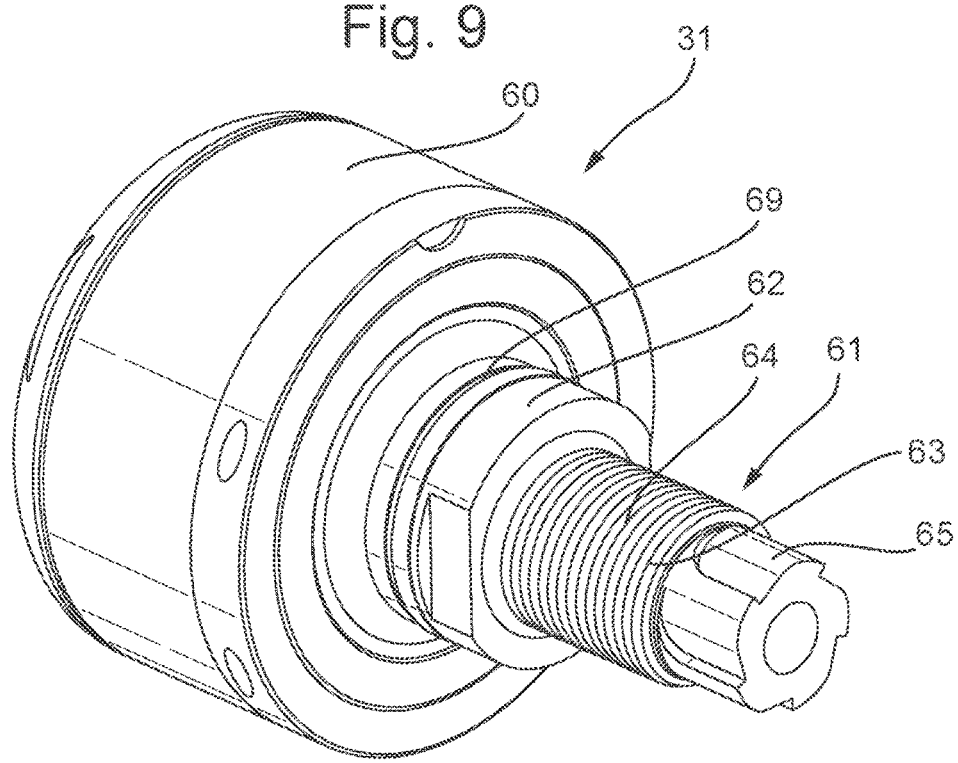
FIGS. 9 and 10 are perspective views of a housing and a retaining, respectively, of a sensor unit in a second configuration.
Figure 10:
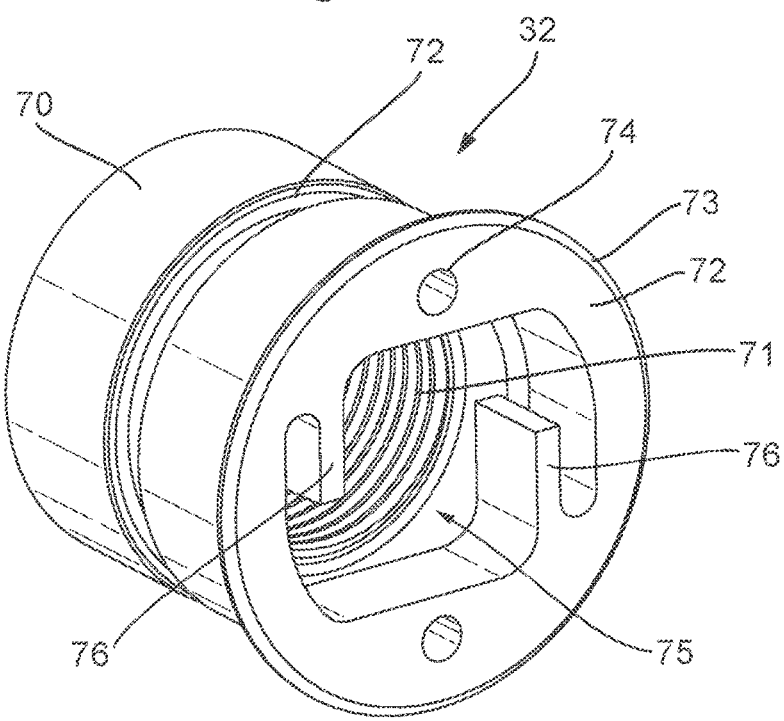

In the second configuration, the sensor unit 30 comprises a housing 31 and a retaining element 32 as shown in FIGS. 9 and 10 respectively.

The housing 31 comprises a head 60 and a pin 61 that protrudes from the head 60. The pin 61 is configured to fit within the aperture 33 and the retaining member 32 is configured to engage with the pin 61, also within the aperture 33, and there by to retain the sensor unit 30 in the aperture 33.

The head 60 extends laterally of the pin 61 and is wider than the aperture 33. In this manner the head 60 engages the latch 5. As described in more detail below, the head 60 contains the electronic components of sensor circuit 40 of the sensor unit 30. Thus, in contrast to the first configuration where the entire sensor unit 30 fits within the aperture 33, in the second configuration the sensor unit 30 fits within the aperture 33 with the head 60 of the housing 31 protruding outside the latch 5. This enables a larger sensor circuit 40 to be accommodated than in the first configuration.

Desirably the sensor unit 30 is mounted on the latch 5 with the head 60 on the uppermost side of the latch 5. This reduces the risk of damage to the sensor unit 30 by the head 60 coming into contact with the tubulars that pass the latch 5 when in the open position. To similarly reduce the risk of damage to the sensor unit 30, the retaining member 32 does not protrude from the lowermost side of the latch 5.

The pin 61 and the retaining member 32 are arranged as follows to fit within the aperture 33 and engage with each other.

The pin 61 comprises a proximal portion 62 extending from the head 60 and configured to fit within the aperture 32, preferably with a flush fit.

The pin 61 further comprises a distal portion 63 extending from the proximal portion 62. The distal portion 63 is laterally recessed relative to the proximal portion 62 to provide a space within the aperture 33 for the retaining member 32. The distal portion 63 has an external screw thread 64 and ratchet teeth 65 provided around its outer end.

The retaining member 32 comprises a barrel 70 shaped to fit within the aperture 33 in the space formed by the lateral recessing of the distal portion 63. The barrel 70 has an internal screw thread 71 configured to be screwed together with the external screw thread 64 of the pin 61 for engaging the retaining member 32 with the proximal portion 62 of the pin 61 of the housing 31 within the aperture 33.

At its end 72, the retaining member 32 further comprises a flange 73 that extends laterally relative to the barrel 70 and is wider than the aperture 33 in the latch 5 for engaging the latch 5. The aperture 33 has a bevel formed on its rim and the flange 73 is shaped to fit within that bevel, so that the retaining member 32 does not protrude from the lowermost side of the latch 5.

The end 72 of the retaining member 32 is formed with pin holes 74 shaped to fit a pin tool that is used to screw the retaining member 32 onto the housing 31.

The end 72 of the retaining member 32 has a central aperture 75 and a pair of ratchet arms 76 that protrude into the central aperture 75. The ratchet arms 76 are formed integrally with the retaining member 32 and are flexible. The ratchet arms 76 are configured to engage the ratchet teeth 65 provided on the pin 61 of the housing 31, so that the ratchet teeth 65 and the ratchet arms 76 together form a ratchet arrangement that permits screwing of the retaining member 32 onto the housing 31 but prevents unscrewing.

Other configurations for the ratchet arrangement are possible. In one possible alternative ratchet teeth are provided on the retaining member 32 and ratchet arms are provided on the housing 31.

Figure 11:
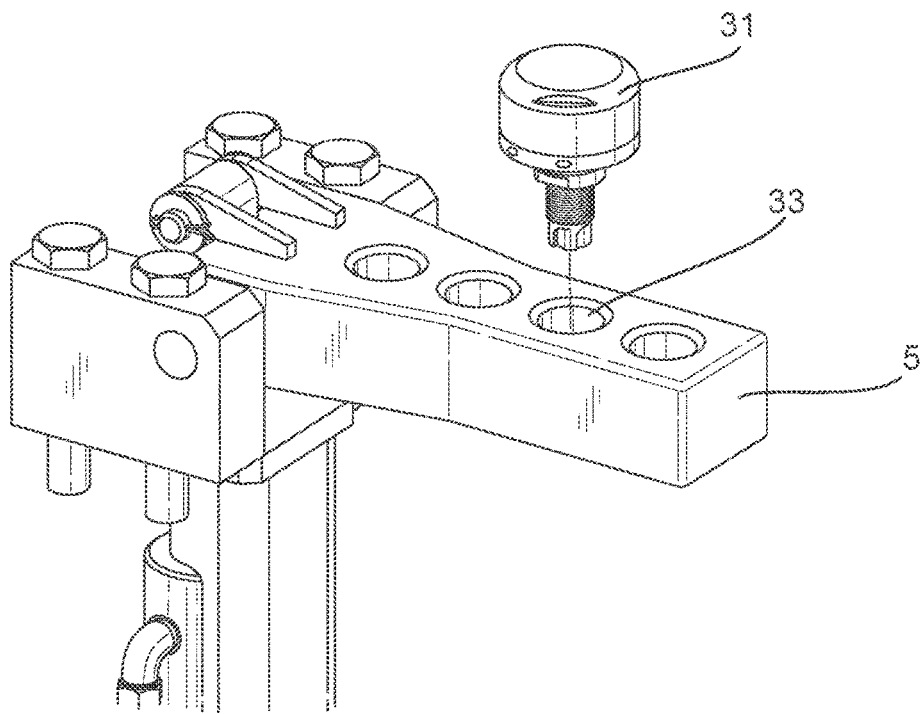
FIGS. 11 to 13 are perspective views of the sensor unit in the second configuration being mounted in a latch.
Figure 12:
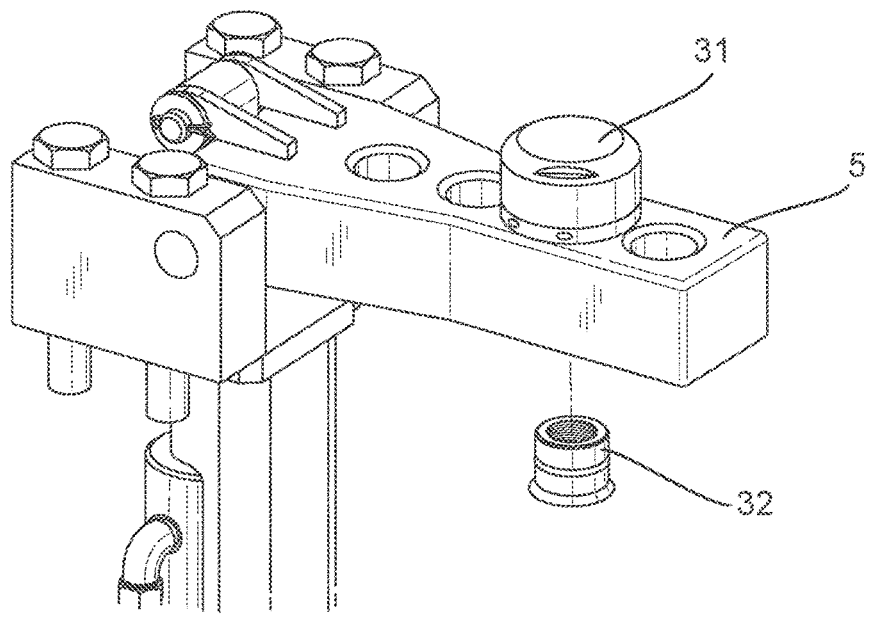
Figure 13:
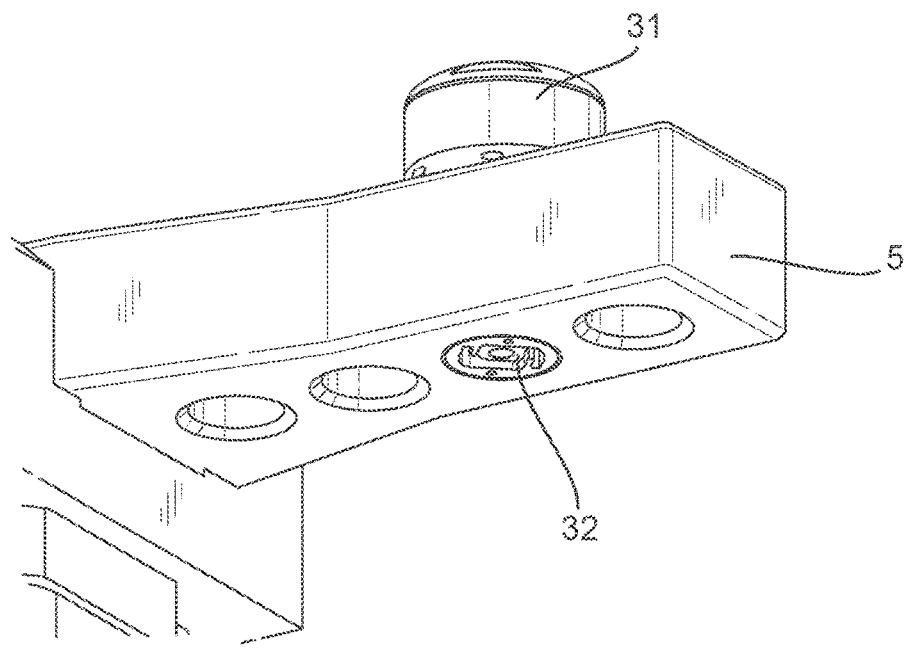
Figure 14:
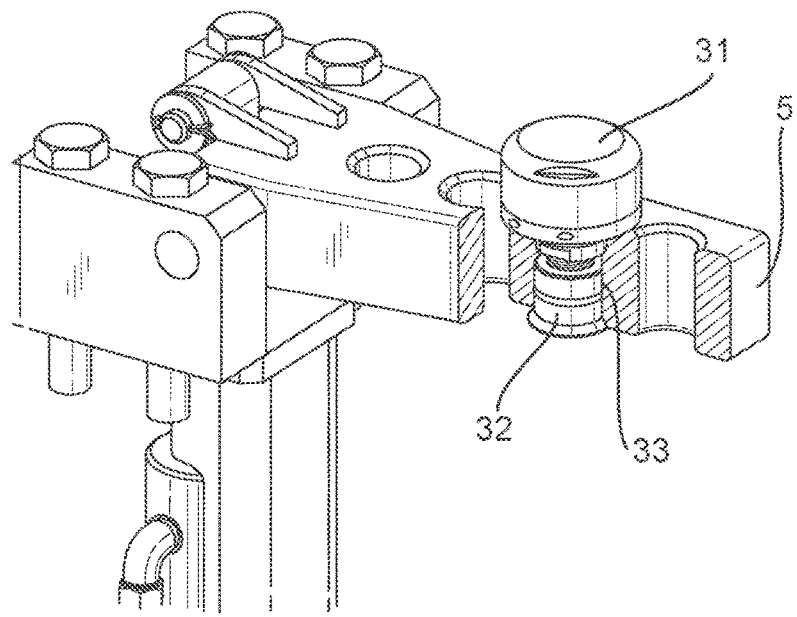
FIG. 14 is a cut-away perspective view of the sensor unit in the second configuration mounted in a latch.

FIGS. 11 to 14 illustrate mounting of the sensor unit 30 on the latch 5. First, as shown in FIG. 11, the housing 31 of the sensor unit 30 is fitted into an aperture 33 on the latch 5. Then, as shown in FIG. 12, the retaining member 32 is inserted into the aperture 33 and screwed onto the housing 31 for engaging the retaining member 32 and the housing 31 and thereby mounting the sensor unit 30 on the latch 5 as shown in FIGS. 13 and 14.

The arrangement described above by which the retaining member 32 engages the housing 31 has particular advantages of providing a robust mounting with a simple construction, but is not limitative. Various changes may be made. In one possible alternative, the pin 30 is modified to provide an internal screw thread and the securing member 32 is modified to provide an external screw thread. In another possible alternative, a different form of engagement is provided, for example a push-fit.

Figure 15:
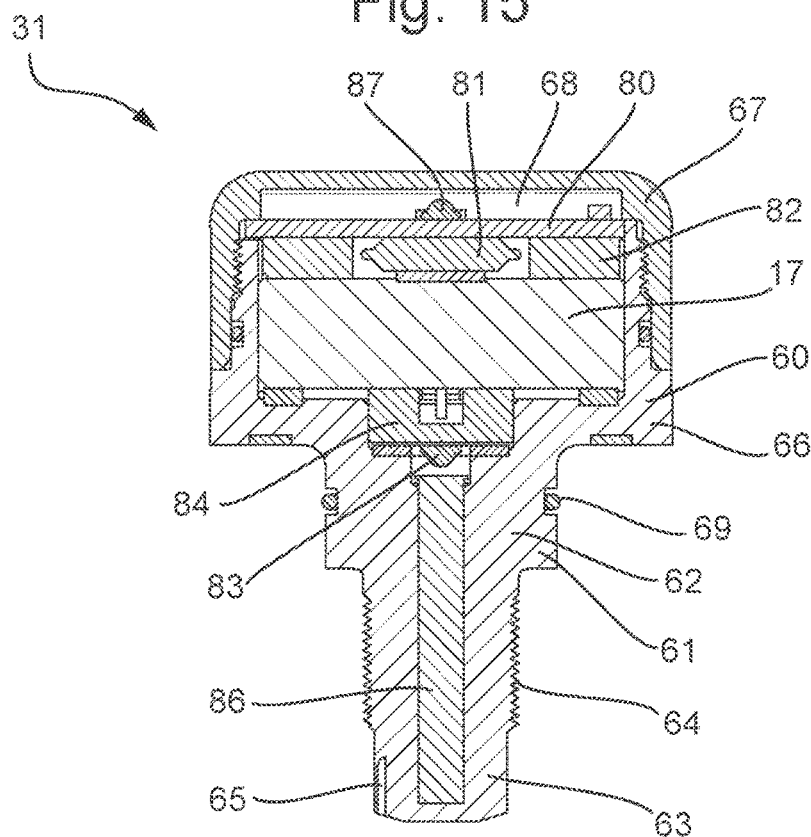
FIG. 15 is a cross-sectional view of the housing of the sensor unit in the second configuration.
Figure 16:
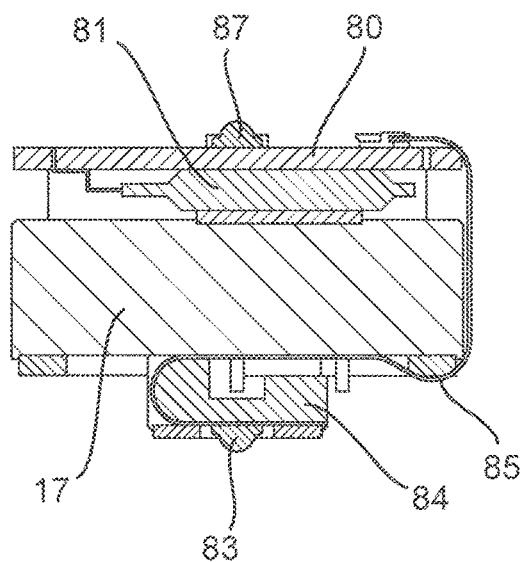
FIG. 16 is a cross-sectional view of the electronic components of the sensor unit in the second configuration, taken perpendicular to the cross-sectional view of FIG. 15.

The internal construction of the housing 31 is shown in FIGS. 15 and 16, and arranged as follows. The head 60 comprises a base 66 and a cap 67 that is fixed over the base 66. In this example, the base 66 is formed integrally with the pin 61. As an alternative the pin 61 may be a separate element that is attached to the base 66, by any suitable means such as adhesive or mechanical fixing. Such an alternative allows the head 60 to be manufactured separately from the pin 61 and retaining member 32, which allows the head 60 to be manufactured in bulk and attached to a pin 61 which may be selected for the specific design of latch 5.

The base 66 and the cap 67 form an enclosure 68 in which the following electronic components of the sensor circuit 40 are contained. The enclosure 68 seals the electronic components and has no external electrical connections which could compromise the integrity. The enclosure 68 is resistant to fluids and ultraviolet light to suitable standards, for example the IP67 standard.

The enclosure 68 contains a battery 17 that acts as a power source for the sensor circuit 40. A circuit board 80 on which the sensor circuit 40 is formed is provided above the battery 17. A capacitor 81 is fixed to the circuit board 80 adjacent the battery 17, and a first spacer 82 beside the capacitor 81 spaces the circuit board 80 from the battery 17.

A first light emitter 83, which is typically a light emitting diode, is arranged beneath the battery 17, spaced from the battery 17 by a second spacer 84. A flexible circuit 85, as best shown in FIG. 16, connects the first light emitter 83 to the circuit board 80.

A light guide 86 extends from the first light emitter 83 along the pin 81 to a position close to the end of the pin 81.

The end of the pin 81 is sufficiently thin to allow output of light transmitted along the light guide 86 from the first light emitter 83. As an alternative, the end of the pin 81 could be formed with a transparent window to allow light output. The light from the pin 81 is output through the central aperture 75 in the retaining member 32. Thus, the first light emitter 83 and light guide 86 together form a light source 16 that may be used as described further below. This provides a compact and convenient arrangement in which the first light emitter 83 is easily connected to the circuit board 80 by the flexible circuit 85. However, an alternative is to omit the light guide 86 and arrange the first light emitter 83 at the end of the pin 81, in which case an electrical connection is provided along the pin 61.

Additionally or alternatively, a second light emitter 87 is arranged on top of the circuit board 80. The cap 67 is sufficiently thin or transparent thin to allow output of light so that the second light source 87 forms an additional or alternative light source 16.

The housing 31 and the retaining member 32 may be fabricated from any suitable material, typically a non-metallic material. The housing 31 may be made from a tough, durable material to withstand shock, vibration, temperature extremes, ice, direct sunlight, UV degradation and washing with a high-pressure jet of water at over 200 Psi. The housing 31 may be made from any suitable material. Suitable materials include, without limitation: carbon fiber; fiberglass (glass reinforced plastic); a fibrous material such as Kevlar; a plastic, for example Polyether ether ketone (PEEK) or any type of Polyaryletherketone (PAEK); an elastomer, for example a rubber; or other engineering thermoplastics. The material may be a reinforced material, for example PEEK reinforced with carbon fiber, or fiberglass. The material may be a composite.

The housing 31 may also incorporate at least one non-metallic liner between the sensor unit 30 and the aperture 33 in the latch 5. Such a liner may provide compressive engagement between the sensor unit 30 and the aperture 33 to accommodate tolerances for the dimensions of the latch 5 which can be broad, thereby increasing friction and integrity. Such a liner may provide, and/or sealing, for example to keep out oils and debris. Such a liner may be an O-ring or a sleeve. By way of example of such a liner in the second configuration of the sensor unit 30, the housing 31 comprises liners in the form of an O-ring 69 extending around the proximal portion 62 of the pin 61 and the securing member 32 comprises an O-ring 77 extending around the barrel 70.

The material of the liner may be of a type known to be suitable for use as a lining in oil and gas applications. Suitable materials for the non-metallic lining can include: polyisoprene, styrene butadiene rubber, ethylene propylene diene monomer rubber, polychloroprene rubber, chlorosulphonated polyethylene rubber, 'Viton', nitrile butadiene rubber. This list is non-limitative and other elastomers could be used. The material may also be a mixture of these and/or other materials.

The sensor unit 30 described above may be adapted to different forms of latch 5 having differently shaped apertures 33 by changing the configuration of the pin 61 and securing member 31.

Figure 17:
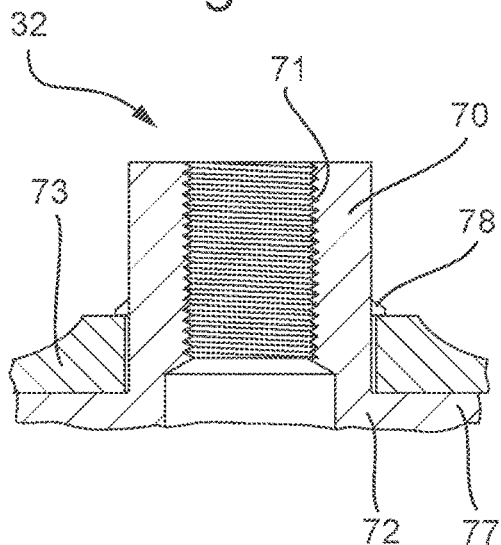
FIG. 17 is a cross-section view of a modified form of securing member

FIG. 17 shows a modified form of the securing member 32 in which the flange 73 is formed as a separate piece which is retained on the end 72 of the securing member 32 by a lip 77 formed integrally with the barrel 70. A clip 78 also protrudes from the barrel 80 for clipping the flange 73 in place prior to mounting on a latch 5. The flange 73 may be free to rotate around the securing member 32. The flange 73 may be adapted to fit different apertures 33 having different shapes, for example circular shapes of different dimensions or non-circular shapes, or to fit with other elements that also fit within the aperture 33, such as a retaining wire for retaining the latch 5 on the bracket 3a. In particular, this design allows for adaptation of the flange 73 without the need to adapt the remainder of the sensor unit 30, which provides advantage in manufacture.

Figure 18:
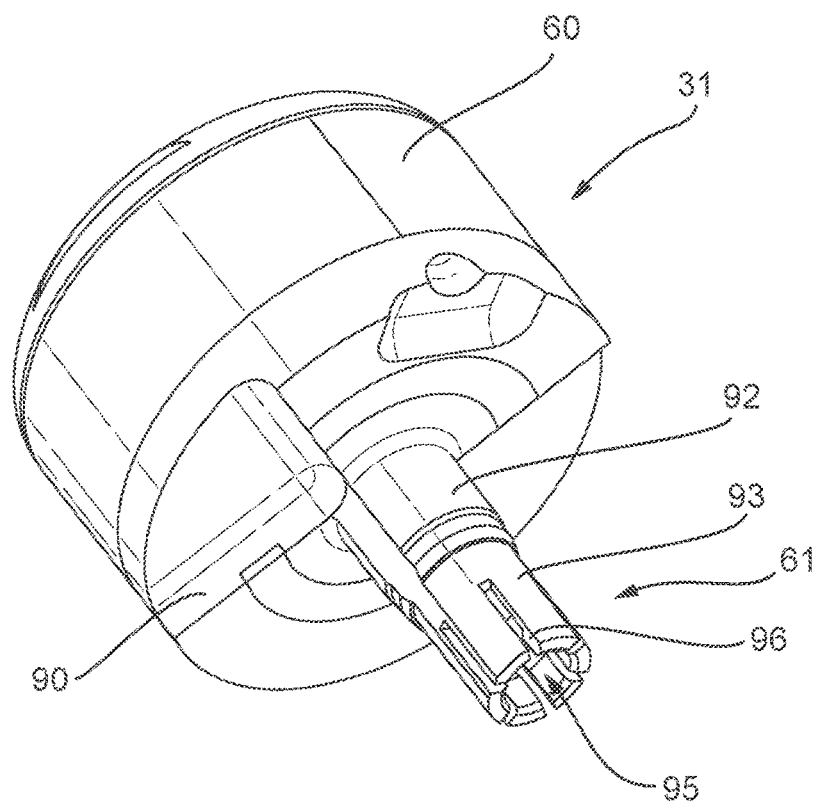
FIGS. 18 and 19 are perspective views of a housing and a retaining, respectively, of a sensor unit in a third configuration.
Figure 19:
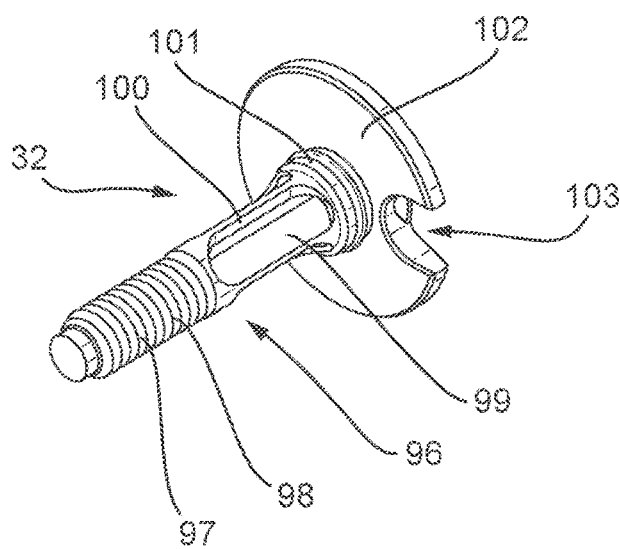

FIGS. 18 and 19 illustrate a sensor unit 30 in a third configuration which will now be described. Elements in common with the first and second configurations are given common reference numerals and have above description applies, except for the differences now explained.

In the third configuration, the sensor unit 30 comprises a housing 31 and a retaining element 32 as shown in FIGS. 18 and 19 respectively.

The housing 31 comprises a head 60 and a pin 61 that protrudes from the head 60. The head 60 has the same design as in the second configuration, except that it includes a cut-out 90 for accommodating a retaining wire for retaining the latch 5 on the bracket 3a. The head 60 contains the electronic components of sensor circuit 40 of the sensor unit 30 in the same manner as in the second configuration and as described in more detail below.

The pin 61 is configured to fit within the aperture 33 and the retaining member 32 is configured to engage with the pin 61, also within the aperture 33, and there by to retain the sensor unit 30 in the aperture 33. However, the pin 61 and the retaining member 32 are arranged differently from the second configuration, as will now be described.

The pin 61 comprises a proximal portion 92 extending from the head 60 and configured to fit within the aperture 32, preferably with a flush fit. The proximal portion 92 has an internal screw thread (not visible in FIG. 18).

The pin 61 further comprises a distal portion 93 extending from the proximal portion 92. The distal portion 93 has a central opening 95 to allow access to the internal screw thread of the proximal portion 92 and comprises ratchet arms 96 provided around its outer end.

The retaining member 32 comprises a bolt 96 configured to fit within the opening 95 of the pin 61. The bolt 96 comprises a distal portion 97 having an external screw thread 98 configured to be screwed together with the internal screw thread of the proximal portion 92 of the pin 61 for engaging the retaining member 32 with the housing 31.

The bolt 96 further comprises a proximal portion 97 having ratchet teeth 100 which are configured to engage with the ratchet arms 96 provided on the pin 61 of the housing 31, so that the ratchet arms 96 and the ratchet teeth 100 together form a ratchet arrangement that permits screwing of the retaining member 32 onto the housing 31 but prevents unscrewing. Other configurations for the ratchet arrangement are possible.

The proximal portion 97 of the bolt 96 further comprises an end portion 101 that is configured to fit within the aperture 32 with a flush fit.

The retaining member 32 further comprises a flange 102 that extends laterally relative to the bolt 96. As in the second configuration, the flange 102 is shaped to fit within the bevel formed in the aperture 33, so that the retaining member 32 does not protrude from the lowermost side of the latch 5.

The flange 102 is rotatably mounted on the end portion 101 of the bolt 96 and thereby is rotatable on the retaining member 32. In addition, the flange 102 has a cut-out 103 for accommodating a retaining wire for retaining the latch 5 on the bracket 3a. As a result of the flange 102 being rotatable on the retaining member 32, the sensor unit 30 may be retro-fitted to a latch 5 without removing a retaining wire that is already attached to the latch 5, because the bolt 96 can be screwed into the housing 31 while the flange 102 remains stationary with retaining wire in the cut-out 103.

In any configuration of the sensor unit 30, optionally, a backup retention device (not shown) may be provided to retain the sensor unit 30 on fingerboard latch assembly 2, for example a wire or rope attached to both the latch 5 and the sensor unit 30. Thus if the retaining member 32 fails, the backup retention device ensues that the sensor unit 30 does not fall and damage other equipment or personnel. A safer sensor unit 30 may thus be provided.

In the above configurations, the sensor unit 30 is shaped to fit within the aperture 33 in the latch 5 allowing a retrofit to an existing latch. As an alternative, the latch 5 may be modified to encapsulate the sensor unit 30 into the latch 5. In that case, the sensor unit 30 may be inserted during manufacture of the fingerboard latch assembly 2. An example of this is illustrated in FIGS. 20 to 21.

Figure 20:
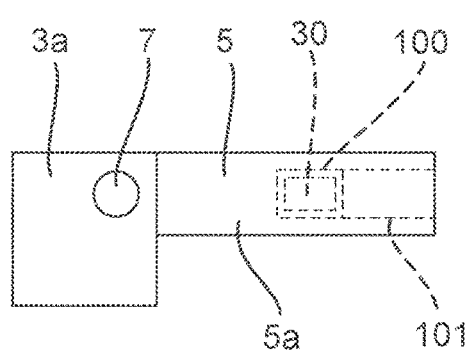
FIG. 20 is a side view of a side view of a fingerboard latch assembly that is modified to integrate a sensor unit.
Figure 21:
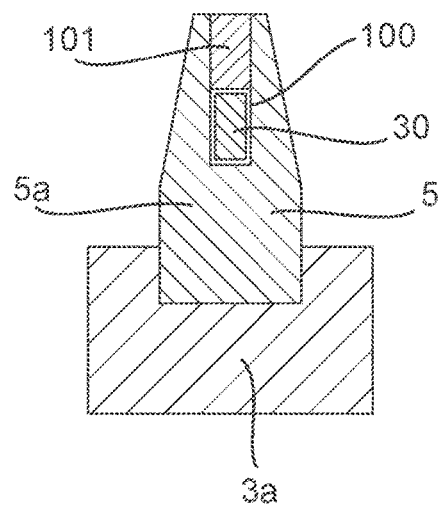
FIG. 21 is a rear cross-sectional view of the fingerboard latch assembly of FIG. 20.

FIGS. 20 and 21 illustrate a fingerboard latch assembly 2 having a latch 5 that has been so modified, FIG. 20 showing the latch 5 in its closed state and FIG. 21 showing the latch 5 in its open state. The latch 5 comprises a latch arm 5a that has a recess 100 which in this example opens at the outer end of the latch arm 5a. The recess 100 may be cylindrical. The inner surface of the recess and the outer surface of the sensor unit 30 may have mating screw threads, so that the sensor unit 30 can be replaced, for example when the battery is depleted or maintenance is required.

Figure 22:
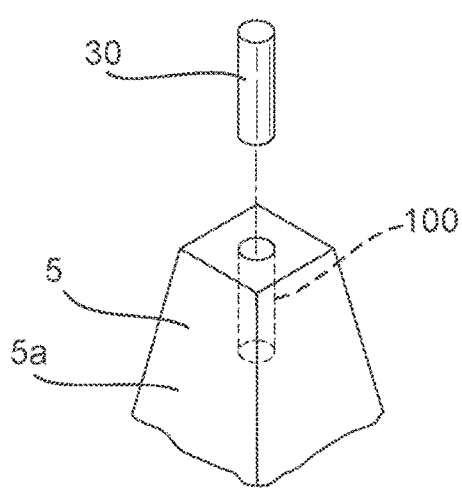
FIG. 22 is a perspective partial view of the latch of the fingerboard latch assembly of FIG. 20 showing mounting of the sensor unit.

During manufacture or replacement, the sensor unit 30 is inserted into the recess 100, as shown in FIG. 22.

Figure 23:
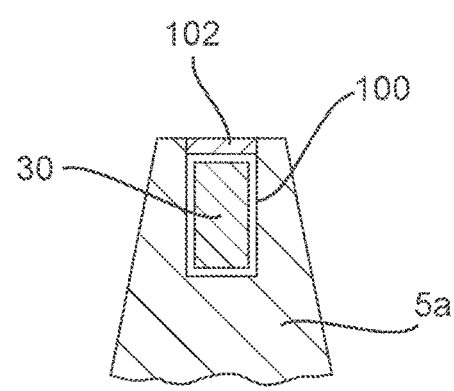
FIG. 23 is a rear cross-sectional partial view of the latch of the fingerboard latch assembly of FIG. 20 in a modified form.

After insertion of the sensor unit 30, the sensor unit 30 is sealed within the recess 100 by a body 101 of material within the end of the recess, as shown in FIGS. 20 and 21. Such material may be, for example, a potting compound, glue or epoxy. In an alternative form shown in FIG. 23, the sensor unit 30 is sealed within the recess 100 by a lid 102, which may take any suitable form, for example a resilient member, threaded part, or screw.

In this case, the sensor unit 30 may have the same form as described above. Where the sensor unit 30 includes a wireless communication interface 47 that communications using radio frequency EM waves, then due the encapsulation of the sensor unit, the latch 5 is made of a non-metallic material that permits transmission of the radio frequency EM waves.

Figure 24:
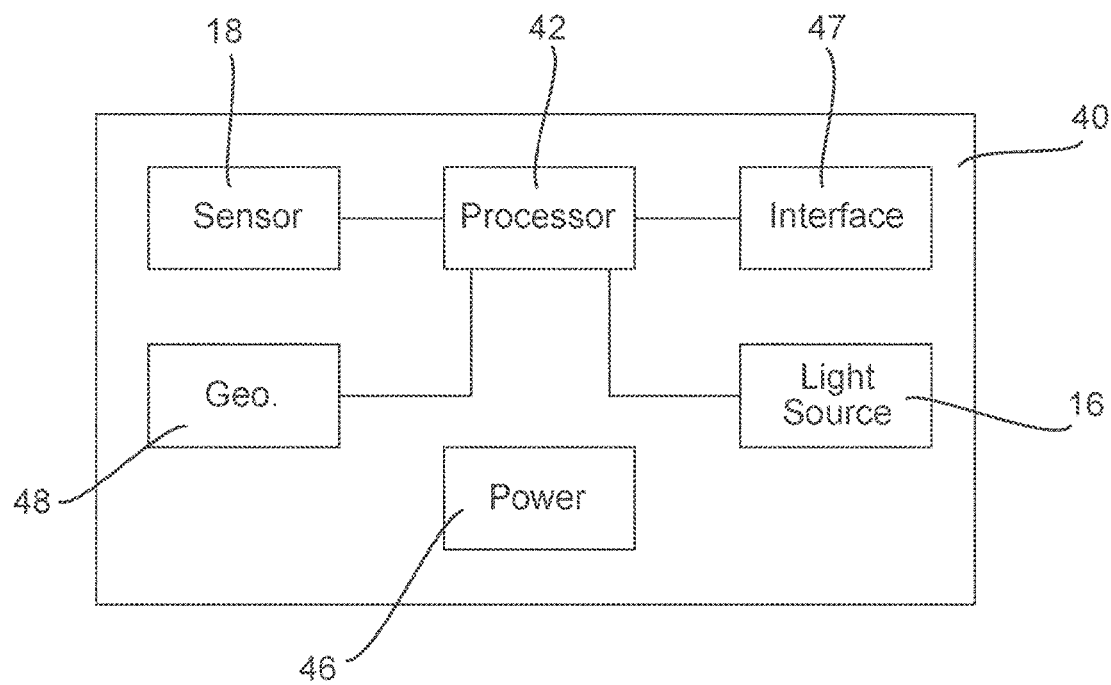
FIG. 24 is a diagram of a sensor circuit of the sensor unit.

The sensor circuit 40 may be arranged as shown in FIG. 24 as will now be described.

The sensor circuit 40 includes an orientation sensor 18 (or plural orientation sensors), a processor 42, a wireless communication interface 47, one or more light sources 16 and a power source 46, that may be the battery 17 in the above description or any other known type of power source as discussed above.

In the above example, a battery 17 is provided as a power source. More generally the power source 46 may be any type of standalone power source known in the art that is capable of providing power to the sensor unit 30 may be provided. For example the power source 46 may comprise a battery, solar cell, supercapacitor or capacitor.

The power source 46 may optionally comprise an energy harvesting device that is configured to harvest ambient energy, e.g. from the fingerboards 1 or fingerboard latch assembly 2. For example the power source may be configured to harvest energy from the motion of the latch 5, for example rotation of the latch 5 in normal use and/or shocks experienced by the latch 5 and/or vibration of the latch 5. In another example, the power source may be arranged to harvest ambient EM energy.

The power source may be provided integral with the sensor unit 30, or removably attached to the sensor unit 30. A sensor unit 30 that is easily maintained may thus be provided.

In an example where the power source 46 is a battery 17, preferably the battery 17 has long life characteristics. The battery 17 is ideally compact in format to fit within the sensor unit 30. To avoid frequent replacement of the sensor unit t30, the battery 17 ideally will have sufficient capacity to power the sensor circuit 40 for tens of thousands of latch cycles over several years (e.g. 20,000 latch cycles and five years). Optionally, the battery 17 may be a Lithium Thionyl Chloride battery that has been selected and configured to last the lifetime of the equipment.

The orientation sensor 18 takes measurements that are dependent on the orientation of the sensor unit 30. In general, the orientation sensor 18 may be any type of sensor suitable for detecting the orientation of the latch 5. The sensor 18 may preferably be a low power sensor such as a MEMS (Micro-Electro-Mechanical Systems) sensor, which may be for example configured as an inclinometer, accelerometer or gyroscope. Examples of alternative types of sensor that could be used include: tilt ball sensor; infrared; laser; acoustic; capacitive; magnetic, antenna polarization or Hall-effect sensors. As the sensor unit 30 is mounted on the latch, the sensor 30 may be of a type that is relatively simple and of low power compared to a sensor mounted on the latch bracket that indirectly senses the latch 5. Thus, the sensor unit 30 is inexpensive and capable of being run where the power source 46 has limited capacity, for example being a battery.

The processor 42 is supplied with the measurements from the orientation sensor 18 and processes them. The processor 42 derives, from the measurements, an orientation signal representing the orientation of the latch 5 with respect to the latch bracket 3. In general terms, this is possible because the sensor unit 30 is mounted in the latch 5 and so the orientation of the sensor unit 30 is indicative of the orientation of the latch 5.

The orientation signal may represent the value of the present orientation of the latch 5 across its range of movement with respect to the latch bracket 3. In this case, the value of the present orientation may be derived from the measurements from the orientation sensor 18 using a simple geometrical calculation.

Alternatively, the orientation signal may simply represent that the present orientation of the latch is an open state corresponding to the open position O, a closed state corresponding to the closed position C, or an intermediate state corresponding to any position intermediate the open position O and the closed position C. For example the open state and the closed state may be taken to correspond to the latch 5 being within a predetermined range of angles, for example 6 degrees, of the open position O and the closed position C, respectively. In this case, the open and closed position may be derived by applying a suitable threshold condition on the successive measurements from the orientation sensor 18. In this case, an orientation signal that represents the value of the orientation of the latch 5 may or may not be explicitly derived, but the threshold condition is related to the measurements from the orientation sensor 18 on the basis of similar geometrical calculation.

The orientation signal derived by the processor 42 is supplied to the wireless communication interface 47 which communicates the orientation signal wirelessly to a monitoring system 50, as described below.

The wireless communication interface 47 provides wireless communication and may be a radio communication interface arranged to transmit signals using radio frequency electromagnetic (EM) waves. A frequency may be selected that has a wavelength that does not suffer from attenuation or reflections from drilling pipe and tubulars secured in the fingerboards 1. To minimize reflections and loss of signal, a radio frequency may be selected that has a wavelength that is less than a minimum spacing between plural fingerboard latch assemblies 2 mounted on a fingerboard land hence less than a minimum spacing between tubulars stored therein. The frequency selected should not interfere with marine communications equipment. Optionally, the frequency selected may be between 2 and 3 GHz.

The wireless communication interface 47 may be unidirectional and merely transmit information from the sensor unit 30, or may be bidirectional and transmit and receive information. The wireless communication interface 47 may implement any suitable transmission protocol.

The wireless communication interface 47 is used to wirelessly communicate the orientation signal to the monitoring system 50 under the control of the processor 42.

In addition, the processor may associate metadata with the orientation signal. Such associated metadata may be wirelessly communicated with the orientation signal.

The metadata may be generated by the sensor units 30 monitoring latches 5 throughout an array of fingerboards 1. The metadata may include includes time information, for example date and time. The metadata may include latch characteristics such as sensor identity, latch identity, number of latch cycles, count of latch open, count of latch being in open position, count of latch being in closed position, latch speed, latch acceleration, sensor battery level, orientation sensor signal level, signal polarization, antenna signal strength, sensor location, or self-diagnostic information, for example relating shocks or vibration or recorded anomalies or warnings logged.

The sensor circuit 40 may include a geolocation unit 48 arranged to detect the location of the sensor unit 30, for example a global position system (GPS) unit. In this case, the metadata may include the location detected by the geolocation unit 48. This can be useful to indicate the location of plural sensor units 30 arranged across an array of fingerboards 1.

The sensor circuit 40 system may include other electronics and processing capability, including memory for storing software, firmware, data and records.

As an alternative to using radio frequency EM waves, the wireless communication interface 47 may employ any other form of wireless communication for communicating the orientation signal, for example acoustic, microwave, ultrasonic or optical communication.

The one or more light sources 16 will now be described. In general, the provisional of light sources 16 is optional, but the light sources 16 may be provided, in addition to, or as an alternative to, the use of the wireless communication interface 47 for communication of the orientation signal and other information.

The light sources 16 may be provided in any location in the sensor unit 30 that is visible, for example in the housing 31 or in the retaining unit 32. In the second configuration of the sensor unit 30 described above, the light source 16 is formed by the light emitter 83 and light guide 86 together.

The sensor unit 30 is typically mounted so that the light sources 16 are directed downwards. As fingerboard latch assemblies 2 are typically mounted in a high location, this means they are visible from below. It also keeps them cleaner, reducing the risk of obscuring the output light.

The light sources 16 may be of any type, but typically may comprise light emitting diodes. The light sources 16 may emit light in any suitable wavelength band, for example infrared, visible or ultraviolet.

The light output by the one or more light sources 16 is modulated in accordance with the orientation of the latch 5 sensed by the sensor 18, under the control of the processor 42. Thus a reliable indication of the orientation of the latch 5 may be provided.

Modulating a light source to represent the orientation of the latch allows for a wireless sensor unit to be provided that is suitable for use in remote locations without the need to make an electrical connection. The light sources 16 may provide instant indication of tubular security.

The modulation of the light sources 16 may be implemented in a number of ways, some non-limitative examples being as follows.

In the simplest case, the light sources 16 may be in an on or off state corresponding to two different orientations of the latch 5, e.g. open and closed positions. For example, a lit light source may identify that the latch 5 is in a closed position, and an unlit light source may indicate that the latch is in an open position.

Alternatively, the modulation may be a change in illumination timings (e.g. flashing rate) of the light sources 16. For example, two (or optionally more) illumination timings may indicate two (or optionally more) orientations of the latch 5, for example a closed position and an open position (and optionally one or more other intermediate orientations).

In one example, the output of the light sources 16 is flashed on and off, but modulated by varying the period. This is advantageous because power is saved compared to a continuous output of light.

In this case, the time for which light source is flashed on in each period, in each of the different illumination timings, may be sufficiently long to be detected by a human observer or camera system, depending on which is used to monitor the output. For a human observer, the time for which light source is flashed on is sufficiently long to be visible taking account of the persistence of vision, for example at least 5 ms, preferably at least 8 ms, at least 10 ms, or at least 20 ms. For a camera system, the time for which light source is flashed on is sufficiently long to be reliably detected thereby, taking account of the camera and processing technology used.

To minimize power consumption, the time for which light source is flashed on may the same for each modulation, i.e. irrespective of the length of the period. In that case, modulation may be achieved by changing the time for which light is not output (i.e. for which the light source 16 is off). For example, the time for which light is not output may be 48 ms for one orientation of the latch 5 and may be 480 ms to indicate another orientation of the latch 5.

Alternatively, the modulation may be a change in the color of light output by the light sources 16. For example, two (or optionally more) colors may indicate two (or optionally more) orientations of the latch 5, for example a closed position and an open position (and optionally one or more other intermediate orientations).

The modulation of the light output by the light sources 16 may be monitored by a person or remotely monitored via a camera system such as closed circuit television. Image processing may be used to provide automated monitoring.

The modulation of the light output by the light sources 30 may also represent information in addition to the sensed orientation of the latch.

In one example, modulation as between the light sources 16 of different fingerboard latch assemblies 2 may additionally represent the spatial location of the latch 5. This is advantageous when sensor units 30 are mounted on plural fingerboard latch assemblies 2 of an array, as the modulation may then indicate the orientation and the spatial location of the latches 5 within the array. For example, light sources 16 of different sensor units 30 may output light of different colors in order to provide differentiation between the spatial locations of the fingerboard latch assemblies 2 to which the sensor units 30 are mounted.

In another example, the modulation may indicate maintenance information, for example information about the motion of the latch that is indicative of wear, such as an excessive time for movement between open and closed positions, or a significant latch bounce on reaching the open or closed position.

Where additional information to the orientation of the latch 5 is represented, then the orientation of the latch 5 and the additional information may be represented by different types of modulation, for example representing orientation of the latch 5 by modulation of illumination timing and indicating maintenance information by modulation of color, for example green light indicating a positive condition and red light indicating the need for maintenance.

As an alternative, the sensor unit 30 could be adapted to be mountable on the latch bracket 3a. In that case, the sensor unit 30 is in a fixed location relative to the fingerboard latch assembly and so orientation sensor 18 is modified to be a sensor that detects the orientation of the latch 5 by detecting the proximity of the latch 5 as it rotates with respect to the latch bracket 3a and hence the sensor unit 3. By way of example, the sensor unit 30 may be constructed and arranged as disclosed in US-2016/0076920, albeit with the additional provision of a wireless communication interface 47 and one or more light sources 16 as described herein.

Figure 25:
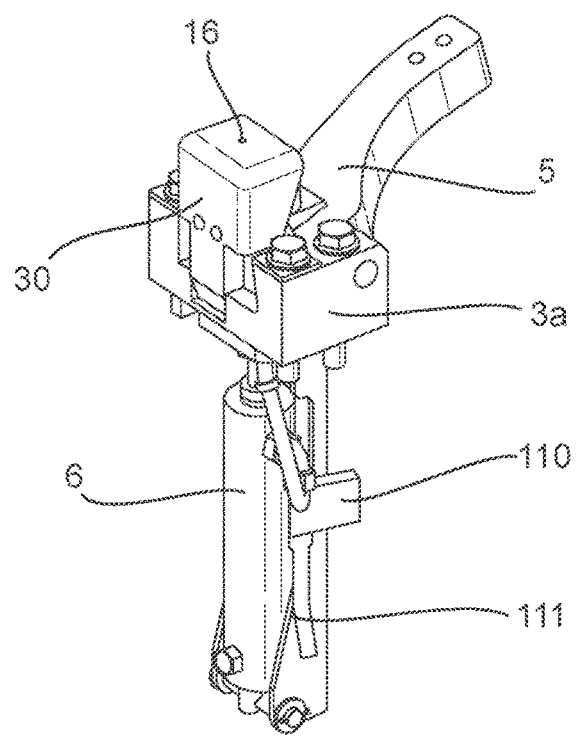
FIG. 25 is a perspective view of a sensor unit mounted on a latch bracket of a fingerboard latch assembly.

FIG. 25 illustrates an example of a sensor unit 30 that is mounted on the latch bracket 3a of a fingerboard latch assembly 2. The sensor unit 30 is arranged as disclosed in US-2016/0076920 and includes an orientation sensor 18 that detects the orientation of the latch 5 by detecting the proximity of the latch 5 as it rotates with respect to the latch bracket 3a and hence the sensor unit 3.

Alternatively, the orientation sensor 18 may be an optical detector such as a photodiode or an imaging device, for example a CCD or digital camera.

Alternatively or additionally, the sensor unit 30 may measure various parameters including but not limited to position, speed, proximity, direction, angle, temperature, acceleration, vibration, density, weight, pressure and surface hardness. The parameter measured may be monitored over time and its trend may be indicative of system condition. These trends, when analyzed using larger data-sets, could be used to predict system failure.

Apart from the form of the orientation sensor 18, the sensor unit 30 is arranged as described above, for example including a wireless communication interface 47 and a light source 16 as described above, or optionally any other form of communication unit, for example acoustic, microwave or ultrasonic.

However, as the sensor unit 30 is mounted on the latch bracket 3a, optionally the power source 46 may be replaced by a power source 110 that is external to the sensor unit 30 and is configured to harvest ambient energy from a pneumatic line 111 used to actuate the pneumatic cylinder 6 of the fingerboard latch assembly 2. This advantageously improves the longevity and autonomy of the sensor unit 30.

Each time the pneumatic cylinder 6 is activated, it is pushed through its stroke by compressed air delivered to the piston via the pneumatic line 111, typically at 90 to 110 psi. The power source 110 comprises a rotor that is turned by this compressed air and an electrical generator driven by the rotor to generate electrical energy. Fabrication of a simple, cheap and compact prototype micro-turbine has been presented by H Fu and Professor E. M. Yeatman in "A Miniature Radial-Flow Wind Turbine Using Piezoelectric Transducers and Magnetic Excitation", Journal of Physics Conference Series, Volume 660, conference 1, and in "A miniaturized piezoelectric turbine with self-regulation for increased air speed range", Appl. Phys. Lett. 107, 243905 (2015). The power source 110 may be based on this micro-turbine.

Power generated in this manner could be used to charge a battery or capacitor or both. The energy is converted from the potential energy of the pressurized fluid to electrical energy in a very short timescale. Therefore, efficient means of storing this energy is required. Given that batteries charge slowly, a super-capacitor may be used as a means of storing electrical energy as charge. A fly wheel could be coupled to the rotor in-line with the fluid flow to store kinetic energy for conversion to electricity using a small generator over longer timescales. A reservoir of pressurized fluid that has been vented during a previous pressurization cycle could be stored and, if appropriated coupled, may be leaked gradually to generate energy over longer timescales or when required.

The power source 110 may be applied in other applications besides a sensor unit for a fingerboard latch assembly. More generally, the power source 110 may be arranged to harvest energy from any pressurized fluid, for example from a pneumatic or hydraulic line by placing the in-line within the pneumatic or hydraulic line. Pressurized fluids are commonplace in industrial settings and are used to power machinery, tools and equipment and the power source 110 may be applied in any such setting to provide a practical and attractive means of powering a miniature system.

Where power is derived from a pneumatic line, the pneumatic line may be connected to an actuator, or valve, such that when pressurized the actuator moves from a first position to a second position compressed air drives an actuator piston and work is done. The rotor of the power source 110 may be mounted in-line with the compressed Likewise, the rotor may be mounted in-line with a valve such that, when open, pressurized air is vented through the rotor for generating electrical energy.

A fly wheel may be coupled intermediate the rotor and the electrical generator to store kinetic energy for conversion to electricity over longer timescales. A reservoir of pressurized fluid that has been vented during a previous pressurization cycle could be stored and, if appropriated coupled, may be leaked gradually to generate energy over longer timescales or when required.

The power source 110 may further include an energy storage device such as a battery or capacitor which is charged by the electrical generator. The power source 110 may power a system incorporating various components such as sensors, communications, processors, electronics and memory or to modulate light emitting diodes or diode lasers for example.

A non-limitative example of the monitoring system 50 is shown in FIG. 26 and will now be described.

The monitoring system 50 comprises plural wireless communication transceivers 51 each arranged to receive orientation signals wirelessly from a plurality of the sensor units 50.

Where the wireless communication uses radio frequency EM waves, the wireless communication transceivers 51 are radio communication transceivers and may be implemented by conventional networking equipment, for example as a router/concentrator. The wireless communication transceivers 51 act as gateways and are distributed to provide overall coverage of the fingerboard latch assemblies 2 in the array of fingerboards 1. For example, the wireless communication transceivers 51 may be located at valve cabinets, to maximize reception and signal coverage. Optionally, the wireless communication transceivers 51 may be located at four locations, east, west, north and south of an array of fingerboards 1.

As the wireless signals will be differently polarized depending on the orientation of the latch 5, the wireless communication transceivers 51 may include plural antennae arranged with a spatial diversity for the purpose of maximizing signal strength irrespective of the polarization of the received signals.

The monitoring system 50 also comprises a central unit 52 with which the wireless communication transceivers 51 are further arranged to communicate wirelessly using radio frequency EM waves for relaying the orientation signals and other information from the wireless communication transceivers 51 to the central unit 52. The central unit 52 performs the overall monitoring and processing of the orientation signals and other information, and may be implemented by any suitable equipment including a wireless communication interface. For example, the central unit 52 may include a conventional computer for processing the received information. The central unit 52 is located at a suitable location to communicate with all the wireless communication transceivers 51. For example the central unit 52 may be located at, or near, the drillers' cabin and/or the Local Equipment Room (LER). There may be more than one central unit, for example mounted on the port and starboard sides above the driller's cabin for the main fingerboard and auxiliary fingerboards respectively, or to cover regions on both sides of the top-drive thereby providing a line of sight or improved coverage of both fingerboards as well as upper and lower fingerboards, or fingerboards and bellyboards.

This topology for the monitoring system 50 provides advantages of wide coverage and reliability, particularly if the wireless communication transceivers 51 have overlapping coverage. However, the monitoring system 50 shown in FIG. 26 is not limitative, and in general may have any suitable configuration.

The monitoring system 50 receives orientation signals and other information from sensor units 30 on each fingerboard latch assembly 2 in an array of fingerboards 1, for simultaneously monitoring of all the fingerboard latch assemblies 2. The monitoring system 50 described above receives information from the sensor units 30 primarily by wireless communication from the wireless communication interfaces 47. Alternatively or additionally, the monitoring system 50 may monitor the light sources 60, for example using cameras.

The monitoring system 50 provides an indication of the orientations of the latches 5 to a user, for example on a display or audibly. The monitoring system 50 may provide a warning when the orientation of any latches 5 is unexpected and/or in a dangerous state.

The monitoring system may compare orientation signals from different sensor units 30 and to detect anomalies therein. For example, where sensor units 30 are located on upper and lower fingerboards 1 arranged above one another monitoring corresponding latches 5 that secure the same length of tubular, then the sensor units 30 may be paired, or their outputs combined. For example, the monitoring system 50 may detect an anomaly if these corresponding latches 5 do not operate simultaneously. For example, if a length of tubular has been placed in the fingerboards 1, both of the corresponding latches 5 on the upper and lower fingerboards 5 should be in the same position. If they are not, the output of the 'paired' sensor units 30 on the corresponding latches 5 of the upper and lower fingerboards 5 can be combined and compared to detect an anomaly and flag a warning to an operator, e.g. via a display.

The monitoring system 50 may also monitor the other information transmitted from the sensor units 30. Such information representing latch characteristics may be may be logged and analyzed to identify latches 5 that are not performing to specification, or may be in need of maintenance or replacement. This information may be analyzed for condition-based monitoring the latches to minimize downtime and, by planning maintenance based on likelihood of latch failure, maximize fingerboard availability and operational efficiency. In addition, the data logs and metadata may be presented to manufacturers, suppliers, customers or regulators to validate equipment warranty, indicate safety performance and to demonstrate compliance with best practice and compliance with regulations.

The invention claimed is:

1. A component of a fingerboard latch assembly, the component comprising:
   a latch, wherein the latch defines a recess;
   a latch orientation sensor unit encapsulated in the latch, wherein
      the latch orientation sensor unit includes:
         an orientation sensor arranged to take measurements that are dependent on the orientation of the sensor unit; and
         a processor arranged to derive an orientation signal representing the orientation of the latch from the measurements;
         a radio communication unit arranged to wirelessly communicate the orientation signal; and
         a power source comprising a battery, and
      the latch orientation sensor unit, including the orientation sensor, the processor, the radio communication unit and the power source, is sealed within the recess that is defined in the latch; and
   a seal that seals the recess, wherein the seal includes one of a lid and a body of material.

2. The component of the fingerboard latch assembly according to claim 1, wherein the latch includes an outer end, wherein the recess extends into the latch from the outer end.

3. The component of the fingerboard latch assembly according to claim 1, wherein the seal is a lid, wherein the lid is one of:
   a resilient member;
   a threaded part; and
   a screw.

4. The component of the fingerboard latch assembly according to claim 1, wherein the seal is a body of material.

5. The component of the fingerboard latch assembly according to claim 4, wherein the body of material is one of:
   a potting compound;

a glue; and an epoxy.

6. The component of the fingerboard latch assembly according to claim 1, wherein the recess is cylindrical.

7. The component of the fingerboard latch assembly according to claim 1, wherein an inner surface of the recess and an outer surface of the latch orientation sensor unit each include mating screw threads.

8. The component of the fingerboard latch assembly according to claim 1, wherein the latch orientation sensor unit incorporates non-metallic lining materials.

9. The component of the fingerboard latch assembly according to claim 1, wherein the radio communication unit is further arranged to wirelessly communicate metadata together with the orientation of the latch.

10. The component of the fingerboard latch assembly according to claim 9, wherein the metadata includes one or more of:

time information;

sensor identity;

latch identity;

number of latch cycles;

count of latch being in open position;

count of latch being in closed position;

latch speed;

latch acceleration;

battery level; and orientation sensor signal level.

11. The component of the fingerboard latch assembly according to claim 10, wherein the latch orientation sensor unit further includes:

a geolocation unit arranged to detect the location of the latch orientation sensor unit, and the metadata includes the location detected by the geolocation unit.

12. The component of the fingerboard latch assembly according to claim 1, wherein the orientation sensor comprises an accelerometer.

13. The component of the fingerboard latch assembly according to claim 1, wherein the latch orientation sensor unit further comprises a housing in which the orientation sensor, the processor, the radio communication unit and the power source are housed.

14. A fingerboard latch assembly comprising:

a latch bracket; and a latch rotatably mounted on the latch bracket, wherein the latch defines a recess;

a latch orientation sensor unit encapsulated in the latch, wherein the latch orientation sensor unit includes:

an orientation sensor arranged to take measurements that are dependent on the orientation of the sensor unit; and a processor arranged to derive an orientation signal representing the orientation of the latch from the measurements;

a radio communication unit arranged to wirelessly communicate the orientation signal; and a power source comprising a battery, and the latch orientation sensor unit, including the orientation sensor, the processor, the radio communication unit and the power source, is sealed within the recess that is defined in the latch; and a seal that seals the recess, wherein the seal includes one of a lid and a body of material.

15. The component of the fingerboard latch assembly according to claim 1, wherein the latch is made of a non-metallic material.

16. The fingerboard latch assembly according to claim 14, wherein the latch is made of a non-metallic material.

* * * * *